United States Patent [19]

Kamiya

[11] Patent Number: 4,464,061

[45] Date of Patent: Aug. 7, 1984

[54] LINEARIZER CIRCUIT AND AN ELECTRONIC WATCH INCORPORATING SAME

[75] Inventor: Kenji Kamiya, Ena, Japan

[73] Assignee: Ricoh Watch Co., Ltd., Aichi, Japan

[21] Appl. No.: 293,223

[22] PCT Filed: Dec. 19, 1980

[86] PCT No.: PCT/JP80/00314

§ 371 Date: Aug. 7, 1981

§ 102(e) Date: Aug. 7, 1981

[87] PCT Pub. No.: WO81/01888

PCT Pub. Date: Jul. 9, 1981

[30] Foreign Application Priority Data

Dec. 20, 1979 [JP] Japan .................................. 54-164680
Jul. 7, 1980 [JP] Japan ................................... 55-91706

[51] Int. Cl.³ ....................... G04B 17/12; G04B 17/20
[52] U.S. Cl. .................................... 368/202; 368/201; 331/176
[58] Field of Search ............... 368/200, 201, 202, 156, 368/158; 331/176

[56] References Cited

U.S. PATENT DOCUMENTS

| | | | |
|---|---|---|---|
| 3,713,033 | 1/1973 | Frerking | 331/116 R |
| 3,843,872 | 10/1974 | Shimomura | 235/92 MT |
| 3,978,650 | 9/1976 | Hashimoto et al. | 331/176 |
| 4,159,622 | 7/1979 | Akahane | 331/176 |
| 4,160,183 | 7/1979 | Kusters | 310/361 |
| 4,272,840 | 6/1981 | Morozumi et al. | 368/200 |
| 4,345,221 | 8/1982 | Zumsteg | 331/176 |

FOREIGN PATENT DOCUMENTS

| | | | |
|---|---|---|---|
| 19591 | 11/1980 | European Pat. Off. | |
| 50-71362 | 6/1975 | Japan | |
| 3145675 | 5/1977 | Japan | |
| 54-59173 | 10/1977 | Japan | |
| 53-88762 | 8/1978 | Japan | 368/202 |
| 55-76978 | 12/1978 | Japan | |
| 55-93306 | 7/1980 | Japan | 331/176 |
| 2004155 | 3/1979 | United Kingdom | 331/176 |

*Primary Examiner*—Bernard Roskoski

[57] ABSTRACT

A linearizer circuit comprises a frequency mixer which mixes a first frequency varying in accordance with a change in a parameter and a second frequency from a reference oscillator which has no dependence upon any parameter at a given proportion, and a derivation circuit for producing an output pulse corresponding to the average period of an output from the mixer, thus providing a linearized output for the parameter. The linearizer circuit may be assembled into a watch as means to detect the environmental temperature of the watch. By detecting temperature information with this means, a temperature compensation of a clock signal may be achieved in accordance with a temperature offset from a reference temperature.

7 Claims, 15 Drawing Figures

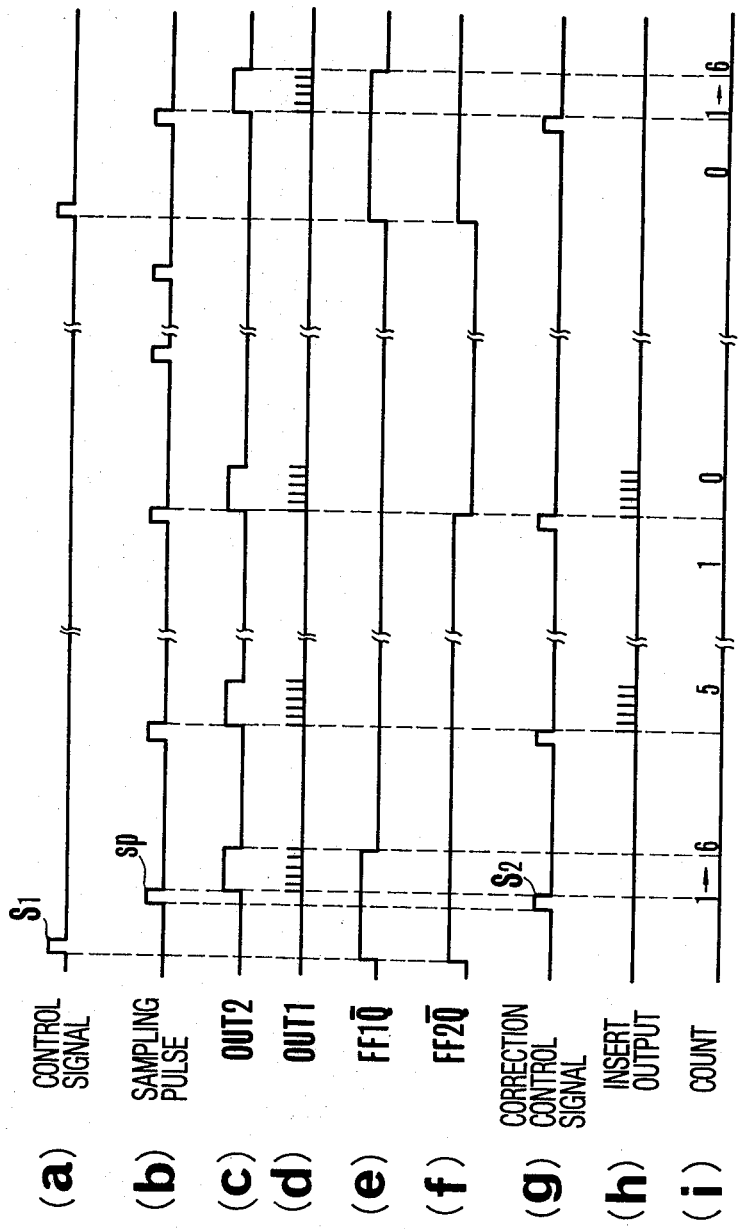

LINEARIZER CIRCUIT AND AN ELECTRONIC WATCH INCORPORATING SAME

FIELD OF THE INVENTION

The invention relates to a linearizer circuit which may be used to detect a physical quantity or parameter such as temperature by converting its change into a frequency, and also to an electronic watch which utilizes such linearizer circuit as temperature detecting means to provide a temperature compensation.

BACKGROUND OF THE INVENTION

Various circuits are known which convert a temperature into a corresponding frequency value so that a temperature change can be detected by sensing the frequency. Such circuits typically have a nonlinear temperature or output response. This makes it impossible to provide a satisfactory temperature compensation in a watch, for example, if the detected output is directly utilized. Therefore, it is necessary that the output response be linearized.

Conventional linearizing means may be categorized into two types, the first in which the response of an element itself is made linear, and the in which the response of the element is digitalized through A/D conversion, which is then subjected to a linearization process. The former type may be exemplified by a combination of a temperature element, for example, a thermistor and a fixed resistor, which is connected in a bridge so that a linear output may be obtained in response to a temperature change. While a linear output response may be obtained with this arrangement, an increased number of additional components such as resistors is required, and also the circuit module increases its size, which is inconvenient for incorporation into an electronic watch, in particular. Additionally, variations in the operational response of the temperature detector circuit as well as of the additional components prevent an output response having a high stability and high linearity from being obtained.

In the latter type, an output from the A/D conversion is utilized to address a read only memory (ROM) to retrieve a corresponding linearized value. Those skilled in the art will appreciate that this results in an extensive system arrangement, lacking in flexibility due to the provision of the ROM.

The accuracy of the electronic watch has been markedly improved since the advent of the quartz oscillator which is used as a oscillator source. However, the quartz oscillator exhibits a temperature-frequency response which is parabolic. This means that while the accuracy of the quartz watch remains stable in a temperature range which corresponds to the apex of the response, the accuracy is less than satisfactory in other temperature ranges. Accordingly, a number of compensation techniques have been proposed to compensate for the temperature response of a quartz watch or a quartz oscillator.

One of proposed temperature compensation techniques employs a capacitor which exhibits a complementary response to the parabolic temperature response of the quartz oscillator and which is connected in an oscillation loop to provide a compensation for the temperature response of the quartz oscillator. However, the degree of accuracy which can be achieved with this technique is limited because a capacitor having a temperature response which is perfectly complementary to that of the quartz oscillator is not available. In addition, the use of a capacitor suffers from disadvantages associated with aging effects and an increased temperature hysteresis.

To overcome such difficulties, there has been proposed the use of a temperature sensor, the output of which is utilized to improve the temperature response of the quartz oscillator in a digital manner. A temperature sensor which has been used in the prior art at this end comprises a quartz oscillator exhibiting a different temperature response from that of a basic oscillator source. The principle of operation is based on deriving a beat signal between outputs from a reference or source oscillator and an oscillator circuit of a temperature sensor. However, quartz oscillators used to form the respective oscillators must have temperature responses which are in a given relationship. As a result, the choice and adjustment of these quartz oscillators and associated components such as capacitors represent a troublesome procedure, resulting in increased cost and increased power dissipation. In addition, when a pair of quartz oscillators exhibiting parabolic temperature responses which have their individual peaks at different temperatures are used, there is a difficulty, in addition to the choice of these quartz oscillators, in that the oscillators must be trimmed to provide an equal oscillation frequency at the apex temperatures. This requires time and labor, but the trimming accuracy is still poor enough to prevent a temperature compensation of a high level from being achieved.

It is a principal object of the invention to overcome above disadvantages by providing a novel and improved linearizer circuit and an electronic watch utilizes such circuit as a temperature detector.

It is another object of the invention to provide a linearizer circuit which facilitates it implementation into a watch by dispensing with external components and facilitating the integration, thereby providing a simple arrangement, a stable characteristic and a high level of flexibility.

It is a further object of the invention to provide an electronic watch in which a reference clock pulse is utilized to produce temperature information in a digital form, thereby enabling a temperature compensation of a high accuracy for the stepping rate while reducing external components required to such compensation to facilitate the integration and minimizing the power dissipation.

SUMMARY OF THE INVENTION

The linearizer circuit of the invention comprises a frequency mixer for mixing at a given proportion a first frequency which changes in accordance with a variation in a parameter such as temperature, voltage or the like, and a second frequency from a reference oscillator which does not depend on any parameter, and a derivation circuit which delivers an output pusle corresponding to an average period of the output signal from the mixer. In this manner, an output characteristic corresponding to a parameter is linearized in a digital manner.

According to another aspect of the invention, the described linearizer circuit is assembled into a clock or watch as means for detecting an environmental temperature for the watch. This means provides information relating to a temperature offset with respect to a reference temperature to enable a correction of a watch signal in accordance with the temperature offset.

BRIEF DESCRIPTION OF THE DRAWINGS

FIG. 15 shows a series of timing charts illustrating the operation of the arrangements shown in FIGS. 13 and 14.

BEST MODE OF CARRYING OUT THE INVENTION

A most preferred embodiment of the invention will now be described with reference to the drawings.

Figure 1:
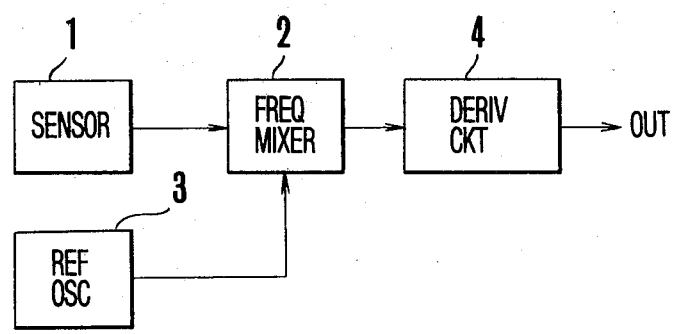
FIG. 1 is a block diagram of a linearizer circuit according to the invention.
Figure 2:
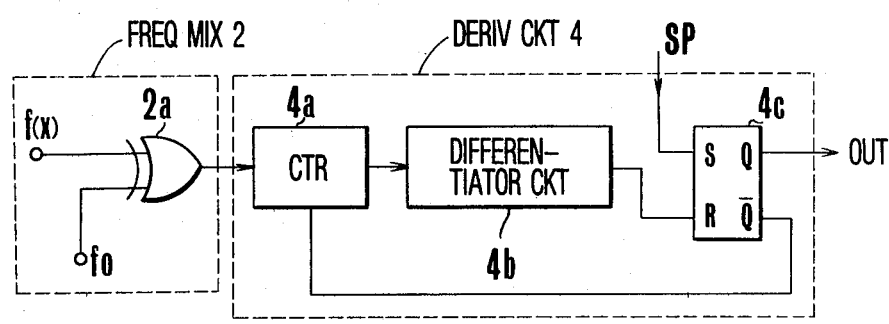
FIG. 2 is a block diagram of one form of a frequency mixer and a derivation circuit used in the linearizer circuit of the invention.

FIG. 1 shows a linearizer circuit of the invention which detects a change in a physical quantity being detected (such as temperature, voltage or the like, and hereafter referred to as a parameter) in terms of a frequency. There is shown a variable parameter-frequency sensor 1 (hereafter simply referred to as a sensor) having a nonlinear temperature response which is used to convert a change in a parameter to be sensed, for example, temperature, into a corresponding frequency. The sensor 1 delivers a first frequency f(x) which varies in accordance with a change in the parameter being detected, for example, temperature, and which is introduced into a frequency mixer 2. Also introduced into the frequency mixer is a second frequency $f_0$ which is produced by a reference oscillator 3 and which has no intended dependence upon any parameter, but in practice is slightly parameter dependent. The frequency mixer 2 functions to add or subtract the second frequency $f_0$ to or from the first frequency f(x) at a given proportion, and its output is fed to a derivation circuit 4 which produces a pulse L(x) having a width corresponding to the average period of the outputs from the frequency mixer 2.

Where the addition is utilized, the frequency mixer 2 preferably comprises an exclusive OR gate 2a as shown in FIG. 2. The derivation circuit 4 preferably comprises a counter 4a, a differentiator 4b which differentiates a count-up signal from the counter, and an R-S flipflop 4c which is reset by an output from the differentiator 4b and which is set by a sampling pulse SP which is supplied at a given time interval. The $\bar{Q}$ output from the flipflop 4c is used to clear the counter 4a while the Q output is used as a control signal for operating the sensor 1 at a given time interval.

The operation of the linearizer circuit of the invention constructed in the manner mentioned above will now be described. It is to be noted that the first frequency f(x) can generally be expressed as follows:

$$f(x) = \gamma f_0 (1 + Ax + Bx^2 + Cx^3 + \ldots) \quad (1)$$

where x is equal to the ratio $\Delta T/T_0$ of the temperature offset $\Delta T$ to a reference temperature $T_0$ when temperature is a parameter to be detected, and $\gamma$ represents the ratio $f(0)/f_0$ of the frequency f(0) when x=0 (a reference point of the parameter) to the reference frequency $f_0$, A, B and C are constants determined by the particular sensor.

Figure 3:
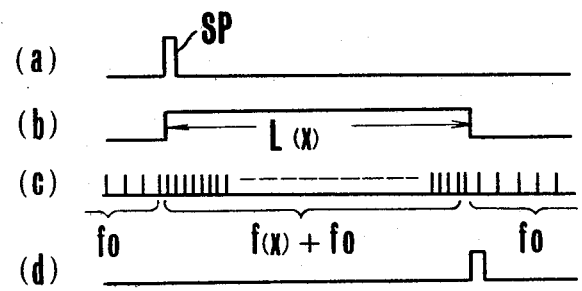
FIG. 3 graphically shows a series of waveforms which illustrate the operation of the arrangement shown in FIG. 2.
Figure 4:
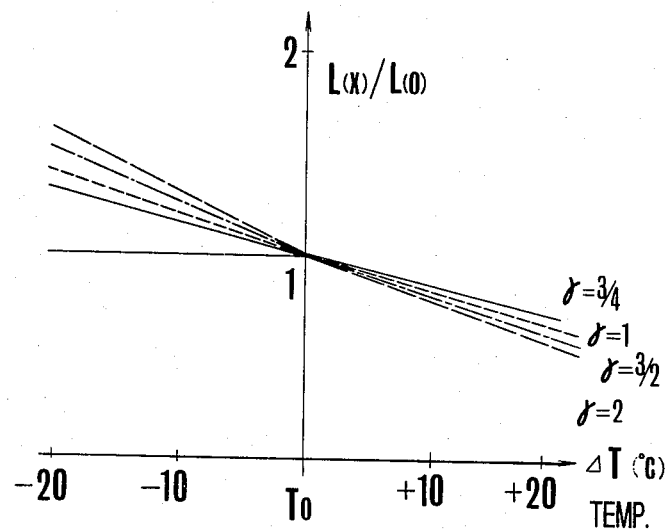
FIG. 4 graphically shows the relationship between a temperature change and an output pulse from the linearizer circuit of the invention.

The operation will be described with reference to FIGS. 2 to 4. When the sampling pulse SP (see FIG. 3a) which is produced at a given time interval is applied to the set terminal of the R-S flipflop 4c, the latter is set, whereby its Q output (see FIG. 3b) operates the sensor 1. In response thereto, the sensor 1 delivers the first frequency f(x), which is added with the second frequency $f_0$ supplied from the reference oscillator 3 in the frequency mixer 2 comprising the exclusive OR gate, with the sum fed to the counter 4a of the derivation circuit 4. Assuming that the counter 4a has a maximum count of N, at the time the counter 4a counts up the output pulses from the mixer 2 to reach the count N, it delivers an output pulse (see FIG. 3d) which is fed through the differentiator 4b to be applied to the reset terminal of the flipflop 4c, thus resetting it. The $\bar{Q}$ output (see FIG. 3c) of the flipflop is applied to the counter 4a, thereby clearing it. Consequently, a pulse is produced at the output of the flipflop 4c of the derivation circuit 4 which has a given width as indicated in FIG. 3b. The width L(x) of the output pulse from the derivation circuit is indicative of, and in fact proportional to, the average period of the outputs f(x)+fo from the mixer 2 (see FIG. 3c) and 4 can be expressed as follows:

$$L(x) = \frac{N}{f(x) + f_0} \text{ (sec)} \quad (2)$$

$$= \frac{N}{f_0 + \gamma f_0 (1 + Ax + Bx^2 + Cx^3 + \ldots)}$$

The equation can be replaced by the following expression:

$$L(x) \propto \frac{1 + \gamma}{1 + \gamma(1 + Ax + Bx^2 + Cx^3 + \ldots)} \quad (3)$$

Assuming that x has a small value, the expression (3) can be developed as follows:

$$L(x) = 1 - \frac{\gamma}{1+\gamma} Ax + \frac{\gamma}{1+\gamma}\left(\frac{\gamma}{1+\gamma} A^2 - B\right) x^2 + \quad (4)$$

$$\frac{\gamma}{1+\gamma}\left(-C + 2\frac{\gamma}{1+\gamma} AB - \left(\frac{\gamma}{1+\gamma}\right)^2 A^3\right) x^3 + \ldots$$

The purpose of the invention is achieved by choosing a value of $\gamma$ such that the quadrature term of x in the above expression disappears. The quadrature term can be eliminated by choosing $$\gamma = \frac{B}{A^2 - B}.$$

In this manner, the linearization of the output characteristic with respect to a change in the parameter x is substantially achieved.

The embodiment described above utilized the addition of the first frequency f(x) and the second frequency $f_0$. It will be noted that the addition occurs for $\gamma > 0$ while the subtraction occurs for $\gamma < 0$. A beat circuit is preferably used to form the frequency mixer 2 when the subtraction is desired. The condition in order for the linearity of the output characteristic be assured by eliminating the quadrature term is given by the following inequality:

$$(x) << \frac{|A|}{\sqrt{|B^2 - AC|}}$$

which indicates the extent of x for which the magnitude for the cubic term remains negligibly small as compared with the linear term.

By way of example, the sensor 1 may comprise an oscillator having a thermistor and a capacitor assembled therein. In this instance, f(x) is expressed as follows:

$$f(x) = \gamma f_0 \exp\left(-B\left(\frac{1}{T} - \frac{1}{T_0}\right)\right)$$

$$= \gamma f_0 \left\{1 + Kx + (\tfrac{1}{2} K^2 - K)x^2 + \left(\tfrac{1}{6} K^3 - K^2 + K\right) x^3 \ldots\right\}$$

where $x = (T - T_0)/T_0$, $K = B/T_0$, T represents the absolute temperature (in °K.) and B the activation energy (in °K.). Accordingly, when a choice is made such that $$\gamma = \frac{K-2}{K+2}$$

in accordance with the requirement mentioned above, L(x) can be linearized with respect to the temperature T. The effective range is $(x) << 2\sqrt{3}/|K|$.

As an example, choose $T_0 = 300°$ K., $B = 3,000°$ K., $K = 10$ and $\gamma = \tfrac{3}{4}$. FIG. 4 graphically shows the behaviour of L(x) plotted against a change of $\gamma$ or $T = T_0 + \Delta T$, $T_0 = 25°$ C. ($= 298°$ K.). It will be apparent from FIG. 4 that L(x) is substantially linear with respect to the temperature in a region adjacent to $T_0$.

In the embodiment described above, the linearization of the output characteristic has been achieved by eliminating the quadrature term. However, depending on the construction of the particular sensor, a higher term may degrade the linearity of the output characteristic, and in such instance, it is also possible to eliminate such higher term. This can be done by providing a plurality of different proportions for mixing f(x) and $f_0$ so that cubic and higher order terms may be eliminated.

As discussed above, in the linearizer circuit of the invention, a linear output for a parameter being detected is produced in a digital manner by using only an output frequency from a reference oscillator which has a high precision. No external components are required, and also the implementation into an integrated circuit is facilitated. Thus, a linearizer circuit is provided which is simple in arrangement, and has a stable characteristic and a high flexibility and which can be easily incorporated into a watch or the like.

Figure 5:
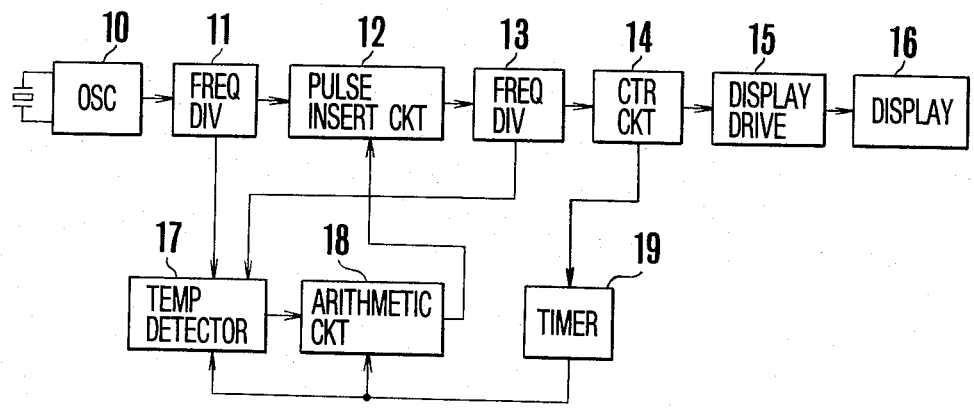
FIG. 5 is a block diagram of an electronic watch which utilizes the linearizer circuit of the invention for temperature compensation.

Several embodiments will now be described which utilize the linearizer circuit mentioned above in a temperature detector of an electronic watch to provide temperature compensation. FIG. 5 shows one embodiment of such electronic watch including an oscillator 10 which employs a quartz oscillator. A first frequency divider 11 divides the output frequency from the oscillator to produce pulses of 16 kHz, for example. A pulse insertion (or extraction) circuit 12 is connected to the output of the frequency divider 11 for inserting (or extracting) a compensation pulse. The output from the pulse insertion circuit 12 is applied to a second frequency divider 13, which produces pulses having a period of one second. A counter unit 14 is adapted to receive the one second pulses from the frequency divider 13, and includes a "second", a minute, an hour and a day counter, the count of which is supplied through a display driver 15 to a display 16, thus indicating the time and the day in a digital manner.

A temperature detector 17 is operable to convert a temperature offset from a reference temperature into a pulse train, which is supplied to an arithmetic circuit 18. The arithmetic circuit 18 operates to produce a number of pulses which is proportional to the square of a temperature change (due to the parabolic temperature response of the quartz oscillator) by operating upon the pulse train signal from the temperature detector 17. The pulses delivered by the arithmetic circuit 18 are fed to the pulse insertion circuit 12 within a given time interval to provide temperature compensation. A timer 19 controls the operation of the temperature sensor 17 and the arithmetic circuit 18, and is adapted to be turned on and off periodically with a given time interval by the counter unit 14.

Figure 6:
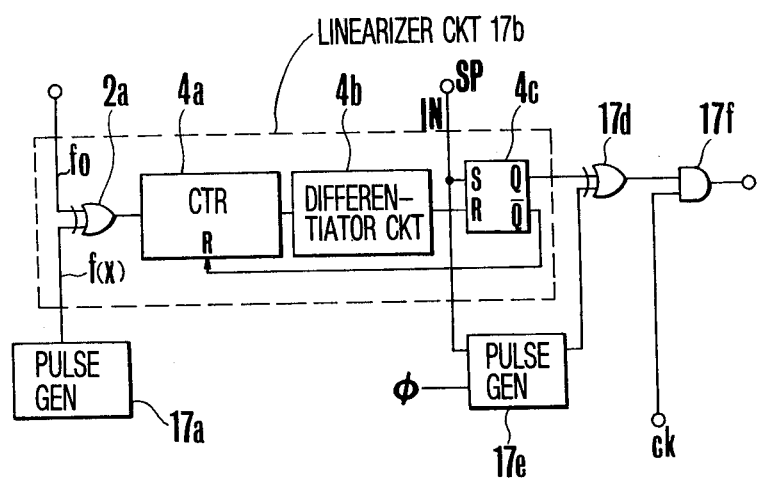
FIG. 6 is a logic diagram of one form of a temperature detector (linearizer) which may be used in the arrangement of FIG. 5.

FIG. 6 shows a specific circuit arrangement of the temperature detector 17. A linearizer circuit of the type mentioned above is indicated at 17b, and one of the input terminals of the exclusive OR gate 2a is connected to the output terminal of a pulse generator 17a having a nonlinear frequency variation with temperature, which may be implemented by utilizing a themistor or like element. The other input terminal of the gate 2a is connected to receive the signal from the crystal oscillator 10 shown in FIG. 5. The output terminal of the gate 2a is connected to an input terminal of the counter 4a, the output terminal of which is connected through the differentiator 4b to the reset terminal of the R-S flipflop 4c, all as mentioned previously. It will also be noted that the $\overline{Q}$ output terminal of the flipflop 4c is connected to the clear or reset terminal of the counter 4a. The linearizer circuit 17b operates in a manner such that when a sampling pulse (SP) is applied to an input terminal IN to set the flipflop 4c, the counter 4a operates to count an output signal from the gate 2a, and when a given count is reached, it produces an output which is differentiated by the differentiator 4b to reset the flipflop 4c. In the manner mentioned previously, a pulse signal having a width which changes linearly with respect to the temperature is produced at the output terminal of the flipflop 4c.

The temperature detector also comprises a reference pulse generator 17e which receives the sampling pulse from the input terminal IN at the same time as such pulse is applied to the linearizer circuit 17b. It produces a pulse signal of a width which is equal to the width of the pulse signal developed by the linearizer circuit 17b when the reference temperature $T_0$ prevails. An exclusive OR gate 17d receives the output from the linearizer circuit 17b and the output from the reference pulse generator 17e at its both inputs, and operates to detect any difference therebetween. The output of the gate 17d enables an AND gate 17f, which passes a clock pulse CK of a frequency sufficiently higher than that of the sampling pulse, in accordance with the output from the gate 17d.

Figure 7:
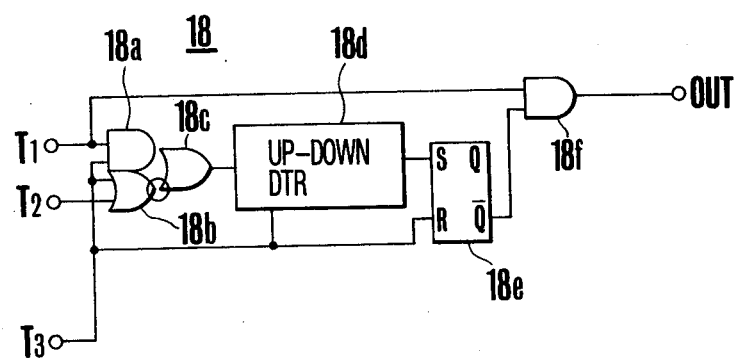
FIG. 7 is a logic diagram of one form of arithmetic circuit used in the arrangement of FIG. 5.

FIG. 7 shows a specific example of the arithmetic circuit 18. It comprises an AND gate 18a having one of its inputs connected to receive the output signal from the temperature detector which is applied to an input terminal $T_1$ and its other input connected to receive the signal from the timer 19 which is applied to an input terminal $T_3$, an NOR gate 18b having one of its inputs connected to receive the clock pulse which is applied to an input terminal $T_2$ and its other input connected to receive the timer signal from the input terminal $T_3$, and OR gate 18c having its inputs connected to the outputs of NOR gate 18b and AND gate 18a, an up-down counter 18d which receives the output from OR gate 18c as an up or down input and counts up when the ouput from the timer 19 applied to the input terminal $T_3$ assumes an "H" level and counts down when the output assumes and "L" level, an R-S flipflop 18e having its set input connected to receive the output from the counter 18d when the count therein reaches zero and having its reset input connected to the input terminal $T_3$, and AND gate 18f having its inputs connected to the $\overline{Q}$ output of the flipflop 18e and the input terminal $T_1$.

Before describing the operation of the electronic watch having a temperature compensation in accordance with the invention, it should be noted that a temperature detector generally exhibits a high temperature coefficient which may be as high as several %/degree if a thermistor or the like is used. On the other hand, a quartz oscillator which may be used as an oscillator source for a watch has a temperature coefficient which is on the order of ppm/degree and thus can be considered constant for temperature changes to which the temperature detector is exposed. Stated differently, it is pointed out that the reference oscillation frequency or its frequency divided output may be directly used as "the second frequency from the reference oscillator which has no dependence upon any parameter" as used in the linearizer circuit of the invention.

Figure 8:
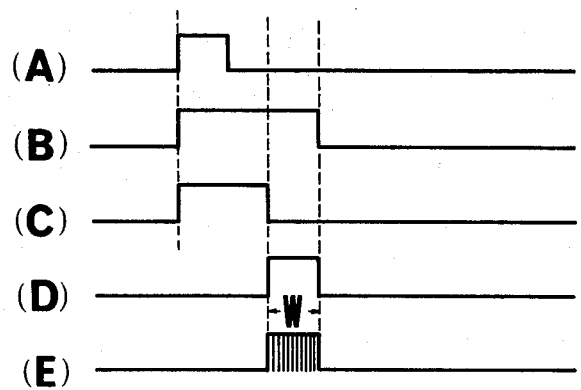
FIG. 8 shows a series of timing charts illustrating the operation of the temperature detector.

A control signal from the timer 19 initiates the operation of the temperature detector 17, and when the sampling pulse having a given period, as indicated in FIG. 8A, is applied to the input terminal IN, the linearizer circuit 17 produces a signal of a width which corresponds to the temperature, as indicated in FIG. 8B. Simultaneously, the reference pulse generator 17e produces a signal (see FIG. 8C) of a given width $\tau_0$ which is equal to the pulse width produced by the linearizer circuit 17 at normal temperature ($T_0 = 25°$ C.). The exclusive OR gate 17d produces a signal, shown in FIG. 8D, which corresponds to the difference between the both pulses. Consequently, the pulse width W is proportional to the magnitude $|T-T_0|$ since the width of the output pulse from the reference pulse generator 17e is chosen to eliminate a phase difference between the outputs shown in FIGS. 8B and C at normal temperature (25° C.).

Figure 9:
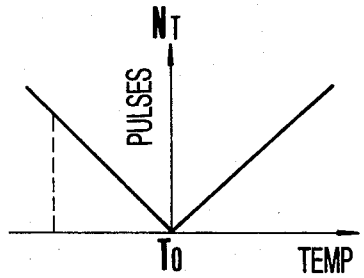
FIG. 9 graphically shows the relationship between the number of pulses detected and the temperature.

Hence, when the pulse having a width $W_1$, $W_2$ is used to enable AND gate 17f shown in FIG. 6, and applying a clock pulse CK of a higher frequency to the clock terminal, a pulse train is developed at the output terminal OUT, as shown in FIG. 8E. The pulse train corresponds to the magnitude $|T-T_0|$. The number of output pulses $N_T$ produced during a single sampling is given by the following relationship:

$$N_T = W\nu \propto |T-T_0|$$

where $\nu$ represents the clock pulse frequency. As shown in FIG. 9, the number of pulses $N_T$ is proportional to the temperature, and varies linearly on opposite sides of the normal temperature $T_0$.

Figure 10:
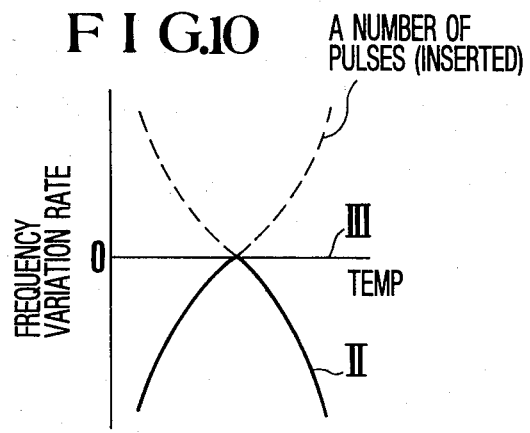
FIG. 10 graphically shows the temperature response of a quartz oscillator shown in the embodiment of FIG. 5 before and after the correction.

It has been assumed in the present embodiment of the invention that the quartz oscillator used in the crystal oscillator has a parabolic temperature response as indicated by a curve II shown in FIG. 10 having an apex at the normal temperature $T_0$ (which represents a typical response of an X5°-cut oscillator in the form of a tuning fork which is most commonly used in wrist watches). Hence, by inserting a number of pulses which is proportional to the term $(T-T_0)^2$ into the frequency divider stage of the watch circuit within a given time interval, there can be obtained a flat temperature response as indicated by a line III in FIG. 10.

Figure 11:
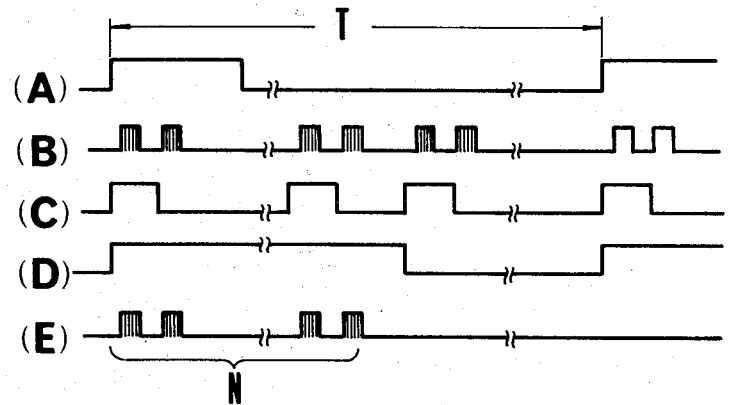
FIG. 11 shows a series of timing charts illustrating the operation of the arithmetic circuit.

The operation of the arithmetic circuit 18 which produces the given number of pulses will now be described. When a control signal having the waveform and period as shown in FIG. 11A is applied to the input terminal $T_3$ from the timer 19, the flipflop 18e is reset, with it $\overline{Q}$ output changing to an "H" level while simultaneously enabling the counter 18d for a count-up operation. Under this condition, during the first sampling operation after the timer 19 has been turned on or when the output from the timer 19 assumes an "H" level, the high level output from the timer 19 enables AND gate 18a, and the pulse train (see FIG. 11B) from the temperature detector 17 which is applied to the input terminal $T_1$ is allowed to pass through gates 18a, 18c to be sequentially applied to the up-down counter 18d. The number of pulses counted corresponds to the number of pulses $N_T$ which are delivered from the temperature detector 17. When the output from the timer 19 reverts to an "L" level, the counter 18d is set for a down count operation. In response to the next sampling pulse which remains the same as that shown in FIG. 8A, or to each pulse as shown in FIG. 11C which is applied to the input terminal $T_2$, the signal is introduced through gates 18b and 18c into the counter 18d, which then incrementally counts down. At the same time, the pulse train signal which is delivered by the temperature sensor 17 and applied to the input terminal $T_1$ for each sampling operation is fed through AND gate 18f, which is enabled by the high level $\bar{Q}$ output from the flipflop 18e as shown in FIG. 11D, to be supplied to the output terminal OUT as shown in FIG. 11E. These output pulses are sequentially inserted into the insertion circuit 12 (FIG. 5) as correction pulses. When the count in the counter 18d reaches zero, its output changes to an "H" level, whereby the flipflop 18e is set, inverting the $\bar{Q}$ output to its "L" level to terminate the insertion of the correction pulses into the circuit 12. Subsequently, when the output from the timer 19 again changes to its "H" level, the above operation is repeated.

Representing the number of pulses detected during an n-th sampling operation by $N_{Tn}$, the total number of pulses detected N which is outputted after the timer 19 is turned on is given as follows:

$$N = N_{T1} + N_{T2} + \ldots + N_{Tn}T_1 \approx N^2 T_1$$

assuming that there is no significant temperature change during one period of the timer. Such number of pulses may be directly inserted into the clock pulse train as described in the previous embodiment, or may be frequency divided before insertion. Where it is required to adjust for a different parabolic coefficient of the quartz oscillator, the frequency division ratio or the period of the timer 19 may be changed. For example, if the frequency division ratio is reduced to one-half or the period of the timer is reduced to one-half its original value, the parabolic factor will be double. If it is necessary to adjust for a difference in the temperature $T_0$ where the apex of the response of the quartz oscillator is located, an input clock $\phi$ to the reference pulse generator of FIG. 6 may be adjusted in accordance with the temperature $T_0$ of the quartz oscillator so that the pulse width becomes as close to $\tau_0$ as possible.

Rather than using the pulse generator 17a and the linearizer circuit 19b to form the temperature detector shown in FIG. 6, a time constant circuit may be formed by a combination of a capacitor and a heat sensitive resistor which is formed by a parallel combination of a thermistor and a resistor so as to provide an improved temperature-resistance response, and the output of the time constant circuit may be connected to an inverter to provide a delay circuit having a time delay which depends on the temperature. Another delay circuit is provided which produces a given time delay irrespective of a temperature change to provide a version of the sampling pulse which is delayed by a given time interval independently from the temperature. These signals may be supplied to the respective input terminals of the exclusive OR gate 17d shown in FIG. 6.

While the correction of a watch having an oscillator which exhibits a parabolic temperature response has been described above, it should be understood that the invention is equally applicable to any other oscillator which exhibits other temperature responses, for example, a linear temperature response.

Figure 12:
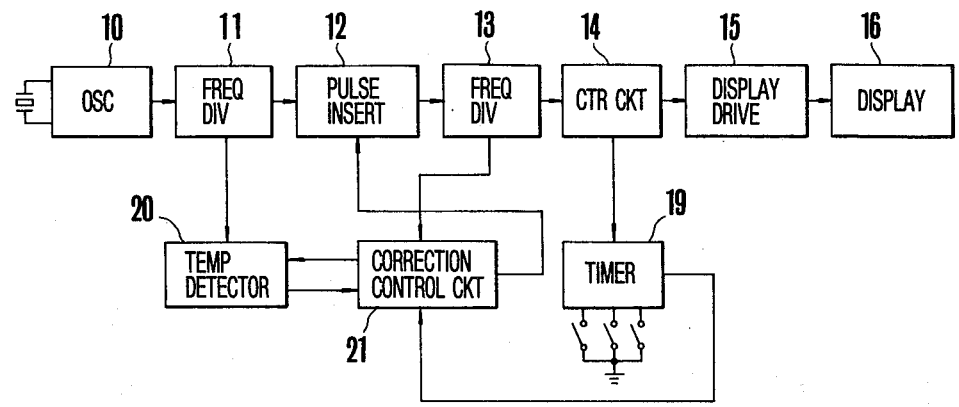
FIG. 12 is a block digram of a second embodiment of the electronic watch utilizing the linearizer circuit of the invention for temperature compensation.

FIG. 12 shows an electronic watch according to another embodiment of the invention. This embodiment includes an oscillator 10, a first frequency divider 11, a pulse insertion circuit 12, a second frequency divider 13, a counter 14, a driver 15 and a display 16, all of which are constructed and connected to each other in the same manner as shown in FIG. 5. A temperature detector 20 converts an offset $\Delta T$ from a reference temperature $T_0$ which may be 25° C., for example, into a corresponding number of pulses. In the same manner as the arrangement of FIG. 5, a clock pulse formed by the first frequency divider 11 is introduced into the temperature detector 20, the output pulse of which is applied to a correction control circuit 21. The correction control circuit 21 operates, when the first sampling pulse SP from the second frequency divider 13 is introduced into it after a control signal $S_1$ from the timer 19 has been supplied thereto, to supply a correction control signal $S_2$ to the temperature detector 20 for counting output pulses therefrom. A number of insert pulses $P_1$ which are equal in number to the count are fed from the correction control circuit 21 into the insertion circuit 12 in timed relationship with the clock pulses.

Figure 13:
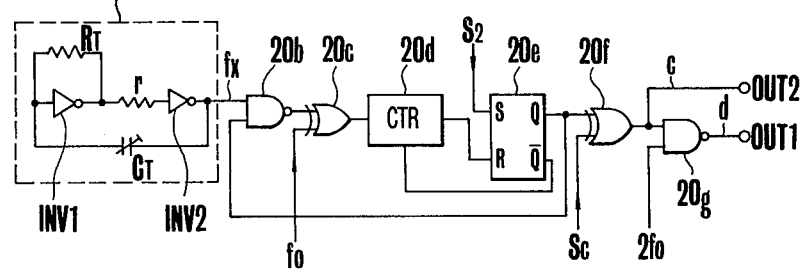
FIG. 13 is a logic diagram of one form of a temperature detector (linearizer) which may be used in the arrangement of FIG. 12.

FIG. 13 shows a specific example of the temperature detector 20 and includes a variable temperature/frequency sensor 20a which converts a temperature change into a corresponding frequency. The sensor 20a comprises inverters INV1, INV2, thermistor $R_T$, trimmer capacitor $C_T$ and fixed resistor r. The first frequency fx which depends on the temperature and which is produced by the sensor 20a is fed through NAND gate 20b to an exclusive OR gate 20c to be mixed therein with a reference frequency $f_0$ derived from a desired frequency divider stage of the first frequency divider 11. The mixed output pulses from the gate 20c are counted by a counter 20d, the count-up signal of which is applied to the reset input of an R-S flipflop 20e having its Q output connected to provide a clear signal to the counter 20d. The correction control signal $S_2$ produced by the correction control circuit 21 is applied to the set input S of the flipflop 20e, with its Q output being applied to the other input of NAND gate 20b and also applied to one input of an exclusive OR gate 20f. The other input of gate 20f receives a comparison signal $S_c$ which is produced by the second frequency divider 13 so as to have no phase difference when the environment temperature T is equal to the reference temperature $T_0$. The output from the gate 20f is applied as a gating input to NAND gate 20g, which also receives a frequency $2f_0$, namely, twice the reference frequency. NAND gate 20g produces at its output terminal OUT1 a number of pulses which is proportional to a temperature offset from the reference temperature. Another terminal OUT2 is connected to the gate 20f for deriving a pulse of a width which is proportional to the magnitude of the temperature offset $\Delta T$.

Figure 14:
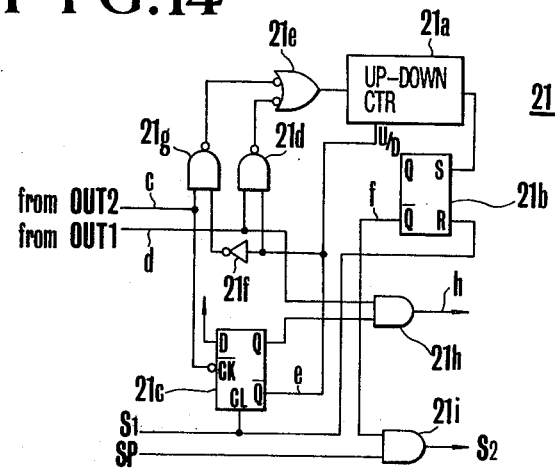
FIG. 14 is a logic diagram of one form of correction control circuit which may be used in the arrangement of FIG. 12.

FIG. 14 shows a specific example of the correction control circuit 21. Specifically, it comprises an up-down counter 21a which counts up pulses delivered at the output terminal OUT1 of the temperature detector 20 and counts down pulses from the terminal OUT2, an R-S flipflop 21b which is set by a zero detection pulse from the counter 21a and which is reset by the control signal $S_1$ from the timer 19, and a D-type flipflop 21c which is reset by the control signal $S_1$ from the timer 19 and which is clocked by the pulse from the terminal OUT2 of the temperature detector. An up count mode and a down count mode of the counter 21a are established in response to the $\bar{Q}$ output of the flipflop 20c which assumes a value of "1" and "0", respectively. The pulse from the terminal OUT1 of the temperature detector 20 is applied to the counter 21a through NAND gate 21d which is controlled by the $\bar{Q}$ output of the flipflop 21c and through NOR gate 21e. The pulse from the terminal OUT2 of the temperature detector 20 is introduced into AND gate 21h which is enabled by the Q output from the flipflop 21c after passing through AND gate 21h, the pulse is supplied as an inserted output to the insertion circuit 12. The correction control signal which is supplied to the R-S flipflop 20e of the temperature detector 20 is derived from AND gate 21i which receives its inputs from the $\overline{Q}$ output of the flipflop 21b and the sampling pulse SP.

Referring to the timing charts shown in FIG. 15, the operation of the above embodiment will be described. Initially, when the control signal $S_1$ (see FIG. 15a) from the timer 19 is introduced into the correction control circuit 21, both the R-S flipflop 21b and the D-type flipflop 21c are reset. Consequently, the $\overline{Q}$ output from the flipflop 21c changes to "1", as shown in FIG. 15e, whereby an up count mode is established in the counter 21a while NAND gate 21g is enabled to permit the pulse from the terminal OUT2 of the temperature detector 20 to be applied to the input of the counter 21a. Since the R-S flipflop 21b is reset, it $\overline{Q}$ output changes to "1", as shown in FIG. 15f, whereby AND gate 21i is enabled to permit the sampling pulse SP, shown in FIG. 15b, to be passed through AND gate 21i to be applied to the R-S flipflop 20e of the temperature detector 20, as the correction control signal $S_2$ (see FIG. 15g), thus setting the flipflop 20e to change its Q output to "1". Consequently, the sensor 20a is activated for oscillation, with the oscillation signal fx being fed through NAND gate 20b to the exclusive OR gate 20c to be added with the reference frequency $f_0$ for input to the counter 20d. As the counter 20d reaches its maximum count, its output pulse is applied to the reset terminal of the R-S flipflop 20e thereby resetting it to permit the $\overline{Q}$ output thereof which assumes "1" level to clear the counter 20d.

In this manner, the R-S flipflop 20e is set and reset each time the sampling pulse SP is applied to the correction control circuit 21, whereby a pulse is derived at the output of the exclusive OR gate 20f or at the terminal OUT2 which has a width proportional to the temperature offset $\Delta T$, as shown in FIG. 15c. Simultaneously, a number of pulses $N(\Delta T)$ which are proportional to the magnitude of $\Delta T$ (see FIG. 15d) is derived at the output of NAND gate 20g or at the terminal OUT1. These pulses N are fed through NAND 21d and NOR gate 21e into the counter 21a, which then count them up. This count up operation takes place only when the initial sampling pulse SP is applied after the control signal $S_1$ from the timer has been produced. In the embodiment shown, the count is equal to "6".

Subsequently, when the pulse delivered to the terminal OUT2 (see FIG. 15c) falls down, the flipflop 21c of the correction control circuit 21 is set. Consequently, the $\overline{Q}$ output of the flipflop 21c changes to "0", whereby a down count mode is established in the counter 21a. Simultaneously, the input of the counter 21a is connected to the terminal OUT2 through NAND gate 21c and NOR gate 21e. Subsequently, the sampling pulse SP is supplied to the correction control circuit 21, whereby the count in the counter 21a is decremented by one each time a pulse is delivered to the terminal OUT2. When the count reaches zero, a zero detection pulse is produced by the counter 21a to set the flipflop 21b, the $\overline{Q}$ output of which changes to "0", thus disabling AND gate 21i. Hence, no subsequent sampling pulse SP is accepted until the control signal $S_1$ from the timer is applied. In the embodiment shown, it is assumed that seven sampling pulses are accepted.

At the time a second, and each subsequent, sampling pulse SP is applied, AND gate 21h of the correction control circuit 21 is enabled by the Q output of the flipflop 21c which assumes "1" level, so that the pulse delivered to the output terminal OUT1 of the temperature detector for each sampling operation is supplied to the insertion circuit 12 as an inserted pulse $P_1$ (see FIG. 15h), which is inserted into the clock pulse train from the first frequency divider 11 with a proper timing. The total number of pulses which are supplied to the insertion circuit 12 through AND gate 21h in this manner is equal to the number of pulses $P_1$ delivered during a single sampling operation (which is equal to 6) multiplied by the number of sampling operations (equal to 6), or $6^2$, thus deriving a number of pulses which is equal to the square thereof.

Speaking generally, the number of pulses delivered is $$N(\Delta T_0) \times \{N(\Delta T_1) + N(\Delta T_2) + \ldots + N(\Delta T_{N(\Delta T_0)})\} = \qquad (5)$$

$$N^2(\Delta T_0) \times \frac{<N(\Delta T)>}{N(\Delta T_0)}$$

where the numeral in the suffix represents the order in the sequence of sampling and $<N(\Delta T)>$ represents an average of $N(\Delta T)$ from $N(\Delta T_1)$ to $N(\Delta T_{N(\Delta T_0)})$. At normal temperature, the equation (5) becomes equal to $N^2(\Delta T_0)$. Under varying temperature condition, $N^2(\Delta T_0)$ is multiplied by a small correction factor $<N(\Delta T)>/N(\Delta T_0)$, thus providing an improved accuracy of the watch over the use of $N^2(\Delta T_0)$ alone.

The insertion circuit 12 comprises an exclusive OR gate. The timing with which a pulse is inserted into the clock pulse train can be determined by delaying the count pulse from the temperature detector by one-half the period with respect to the clock pulses of the insertion stage. The temperature detector 20 may comprise a circuit arrangement as shown in FIG. 6, or may comprise a ring oscillator.

With the described arrangement, the temperature response of the quartz oscillator may be compensated for in a manner mentioned below. Initially, the trimmer capacitor $C_T$ is adjusted to bring the value of $T_0$ of the temperature detector 20 into substantial coincidence with the apex temperature of the quartz oscillator. When the environmental temperature of the watch is offset from the apex temperature ZTC, a number of pulses which are proportional to the square of the temperature offset $\Delta T$ is inserted into the clock pulse train, thereby compensating for the temperature response of the quartz oscillator. The degree of such compensation can be readily controlled by changing the period of the control signal $S_1$ supplied by the timer 19 or by a suitable frequency division of the inserted pulses $P_1$.

As discussed above, with the present embodiment of the invention, there is no need for the use of a precision quartz oscillator for deriving a beat signal as effected in the prior art. Instead, a common quartz oscillator may be utilized to and temperature compensation of high accuracy obtained using a simple logic circuit arrangement. A watch having a high accuracy can be realized at relatively low cost. By utilizing a temperature detector as shown in the second embodiment which operates immediately, the sampling operation reduces the power dissipation, and also facilitates the implementation in an integrated circuit.

Other Possible Uses in Industry

As described above, in addition to its use as means to detect temperature information which is used to provide temperature compensation of an electronic watch, the linearizer circuit of the invention can also be effectively used to provide temperature compensation of a liquid display of multiplex drive type or electrochromic display, or for linearization of a voltage, resistance or current output response.

What is claimed is:

1. A circuit comprising: a reference oscillator generating a preselected frequency; circuit means for generating a first frequency which changes in accordance with a change in a parameter; a frequency mixer having an output, said mixer effecting successive additions or subtractions of said first frequency to or from the preselected frequency generated by the reference oscillator and applying the successive additions or subtractions thereof at said output, and circuit means for producing an output pulse indicative of an average period of outputs from the frequency mixer.

2. A linearizer circuit according to claim 1 in which the circuit means comprises a counter having a predetermined maximum count which is connected to count the output signals from the frequency mixer, and a flip-flop which is set by a count-up signal from the counter and which is reset by a sampling pulse produced at a given time interval.

3. In an electronic watch including a reference oscillator and a frequency divider for generating a clock pulse train and further including a display device, said clock pulse train being used to provide a time display at said display device, a linearizer circuit comprising: a temperature detector for producing a number of pulses which depend on a temperature offset from a reference temperature in response to sampling pulses developed by the reference oscillator, means for periodically producing a control signal indicative of a sampling period, a correction control circuit for counting the number of pulses produced by the temperature detector during said sampling period of the timer and for generating a number of pulses in response thereto, and an insertion circuit for inserting the pulses generated by the correction control circuit into the clock pulse train from the reference oscillator.

4. In the electronic watch according to claim 3 in which the counting of the pulses from the temperature detector and the deriving of the pulses from the temperature detector in accordance with the count are both performed by an up-down counter.

5. In an electronic watch including a reference oscillator which is accurate at some reference temperature, a frequency divider for generating a clock pulse train and a display device, said clock pulse train being used to provide a time display at said display device, a linearizer circuit comprising: a temperature detector including a mixer section for generating output signals which are a mix of a first frequency changing in accordance with a change in the environmental temperature of the watch and a second frequency derived from the reference oscillator, circuit means for producing an output pulse whose width corresponds to the average period of the output signals from the mixer section, and means for producing a number of pulses corresponding to the difference between environmental temperature and said reference temperature in response to pulses developed by the reference oscillator; a timer for periodically producing a control signal; a correction control circuit responsive to said control signal for counting a number of pulses delivered from the temperature detector during the period of timer; and an insertion circuit for inserting the pulses from the correction control circuit into the clock pulse train.

6. A circuit comprising:
(a) a reference oscillator generating a pulse train;
(b) a detector means responsive to an environmental parameter;
(c) means coupled to said reference oscillator and said detector means for generating pulses whose pulse width are proportional to the difference between the environmental parameter detected by said detector means and a normal operating value of the environmental parameter; and
(d) pulse train insertion means responsive to said pulse generating means for inserting additional pulses in said pulse train as a function of the width of said pulses generated by said pulse generating means.

7. The linearizer circuit of claim 6, wherein said pulse insertion means includes an arithmetic circuit for producing said additional pulses proportional in number to the square of the width of the pulses generated by said pulse generating means.

* * * * *